(12) United States Patent
Wasserman et al.

(10) Patent No.: US 9,093,549 B2
(45) Date of Patent: Jul. 28, 2015

(54) BOND HEADS FOR THERMOCOMPRESSION BONDERS, THERMOCOMPRESSION BONDERS, AND METHODS OF OPERATING THE SAME

(71) Applicant: Kulicke and Soffa Industries, Inc., Fort Washington, PA (US)

(72) Inventors: Matthew B. Wasserman, Philadelphia, PA (US); Michael P. Schmidt-Lange, North Wales, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 14/314,149

(22) Filed: Jun. 25, 2014

(65) Prior Publication Data

US 2015/0008254 A1 Jan. 8, 2015

Related U.S. Application Data

(60) Provisional application No. 61/842,081, filed on Jul. 2, 2013.

(51) Int. Cl.
| | | |
|---|---|---|
| *B23K 37/00* | (2006.01) | |
| *H01L 23/00* | (2006.01) | |
| *B23K 3/08* | (2006.01) | |
| *B23K 1/00* | (2006.01) | |
| *B23K 1/008* | (2006.01) | |
| *B23K 3/02* | (2006.01) | |

(52) U.S. Cl.
CPC ............. *H01L 24/81* (2013.01); *B23K 1/008* (2013.01); *B23K 1/0016* (2013.01); *B23K 3/02* (2013.01); *B23K 3/08* (2013.01); *B23K 3/085* (2013.01); *B23K 37/003* (2013.01); *H01L 24/75* (2013.01); *B23K 2201/42* (2013.01); *H01L 2224/81203* (2013.01)

(58) Field of Classification Search
None
See application file for complete search history.

(56) References Cited

U.S. PATENT DOCUMENTS

| | | | | |
|---|---|---|---|---|
| 4,729,060 | A * | 3/1988 | Yamamoto et al. | 361/700 |
| 4,748,495 | A * | 5/1988 | Kucharek | 257/713 |
| 4,920,574 | A * | 4/1990 | Yamamoto et al. | 361/703 |
| 5,080,549 | A | 1/1992 | Goodwin et al. | |
| 5,927,588 | A * | 7/1999 | Narui | 228/6.2 |
| 6,347,734 | B1 * | 2/2002 | Downes | 228/180.21 |
| 2001/0005603 | A1 * | 6/2001 | Kubota | 438/126 |
| 2002/0108707 | A1 * | 8/2002 | Kobayashi et al. | 156/275.5 |
| 2003/0197048 | A1 | 10/2003 | Huang et al. | |
| 2005/0034302 | A1 * | 2/2005 | Hosotani et al. | 29/840 |
| 2005/0081986 | A1 | 4/2005 | Kwon et al. | |
| 2006/0076388 | A1 * | 4/2006 | Sato | 228/102 |
| 2006/0289987 | A1 * | 12/2006 | Chiu | 257/714 |
| 2009/0269178 | A1 | 10/2009 | Trinks | |
| 2012/0088362 | A1 * | 4/2012 | Hwang et al. | 438/615 |
| 2012/0127485 | A1 * | 5/2012 | Yamauchi | 356/614 |
| 2013/0181037 | A1 * | 7/2013 | Nagai et al. | 228/103 |
| 2013/0240115 | A1 * | 9/2013 | Horng | 156/64 |
| 2014/0102616 | A1 * | 4/2014 | Lu et al. | 156/64 |

FOREIGN PATENT DOCUMENTS

| | | |
|---|---|---|
| EP | 1189496 | 3/2002 |
| JP | 2003174042 | 6/2003 |

(Continued)

*Primary Examiner* — Kiley Stoner
(74) *Attorney, Agent, or Firm* — Stradley Ronon Stevens & Young, LLP

(57) ABSTRACT

A bond head for a thermocompression bonder is provided. The bond head includes a tool configured to hold a workpiece to be bonded, a heater configured to heat the workpiece to be bonded, and a chamber proximate the heater. The chamber is configured to receive a cooling fluid for cooling the heater.

30 Claims, 16 Drawing Sheets

(56) References Cited

FOREIGN PATENT DOCUMENTS

| | | | |
|---|---|---|---|
| JP | 2004-063947 A * | 2/2004 | |
| WO | 2005/013354 | 2/2005 | |
| WO | 2006/038610 | 4/2006 | |
| WO | 2007/033701 | 3/2007 | |
| WO | 2007/118511 | 10/2007 | |
| WO | 2010/029075 | 3/2010 | |
| WO | 2011/018375 | 2/2011 | |

* cited by examiner

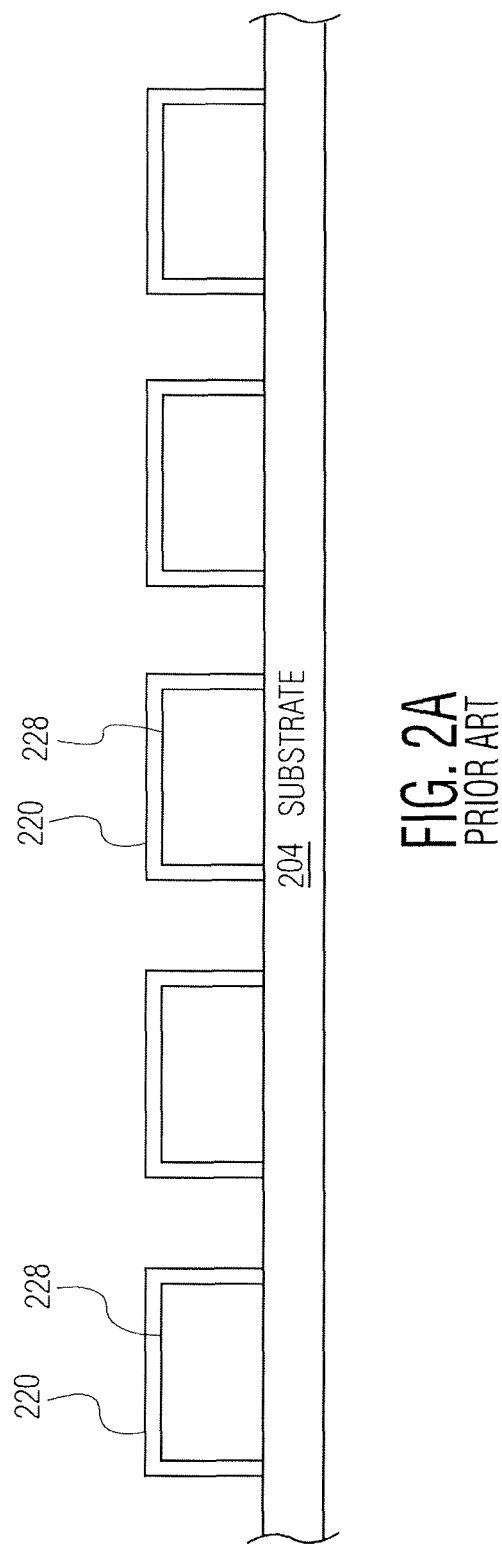

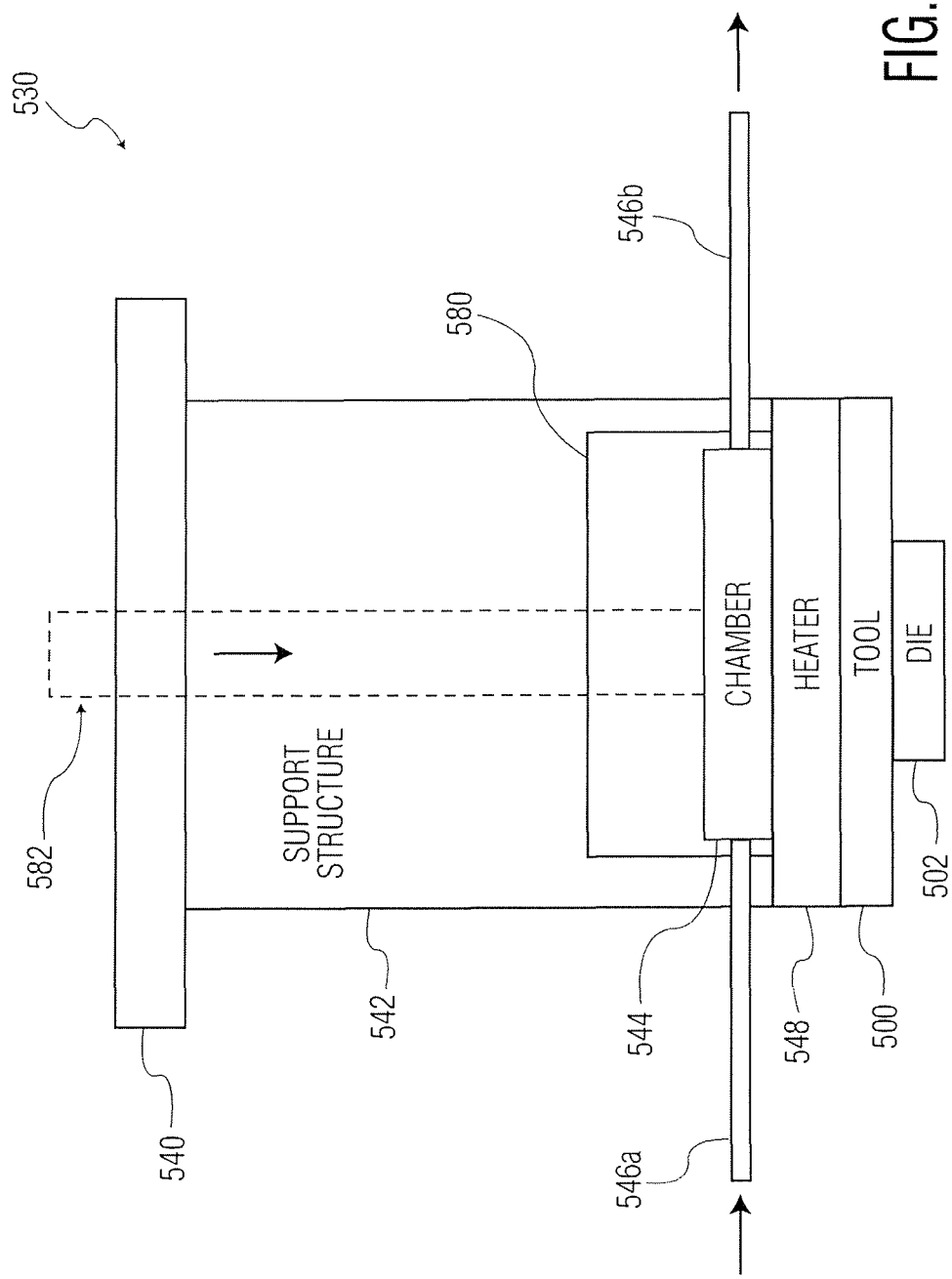

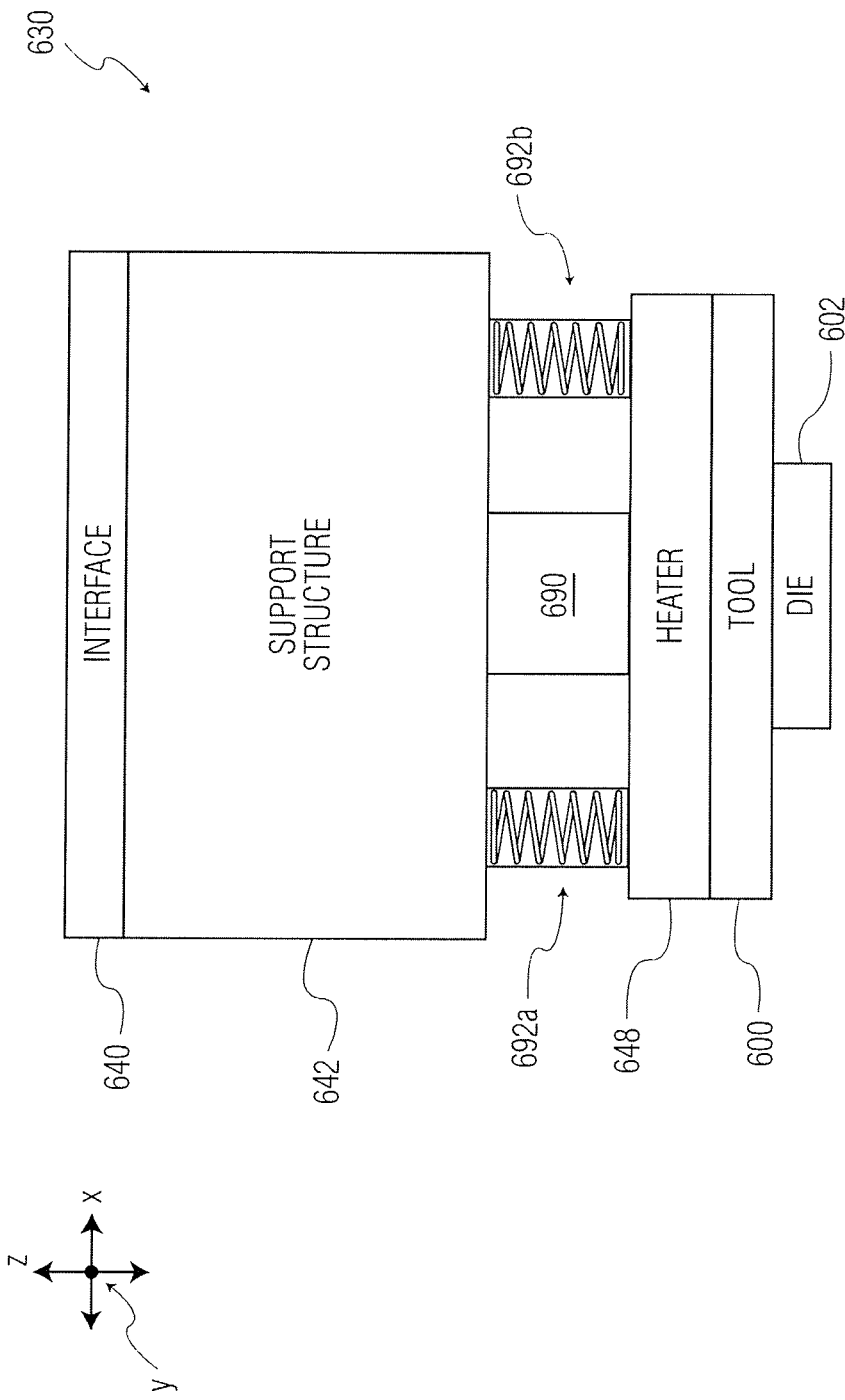

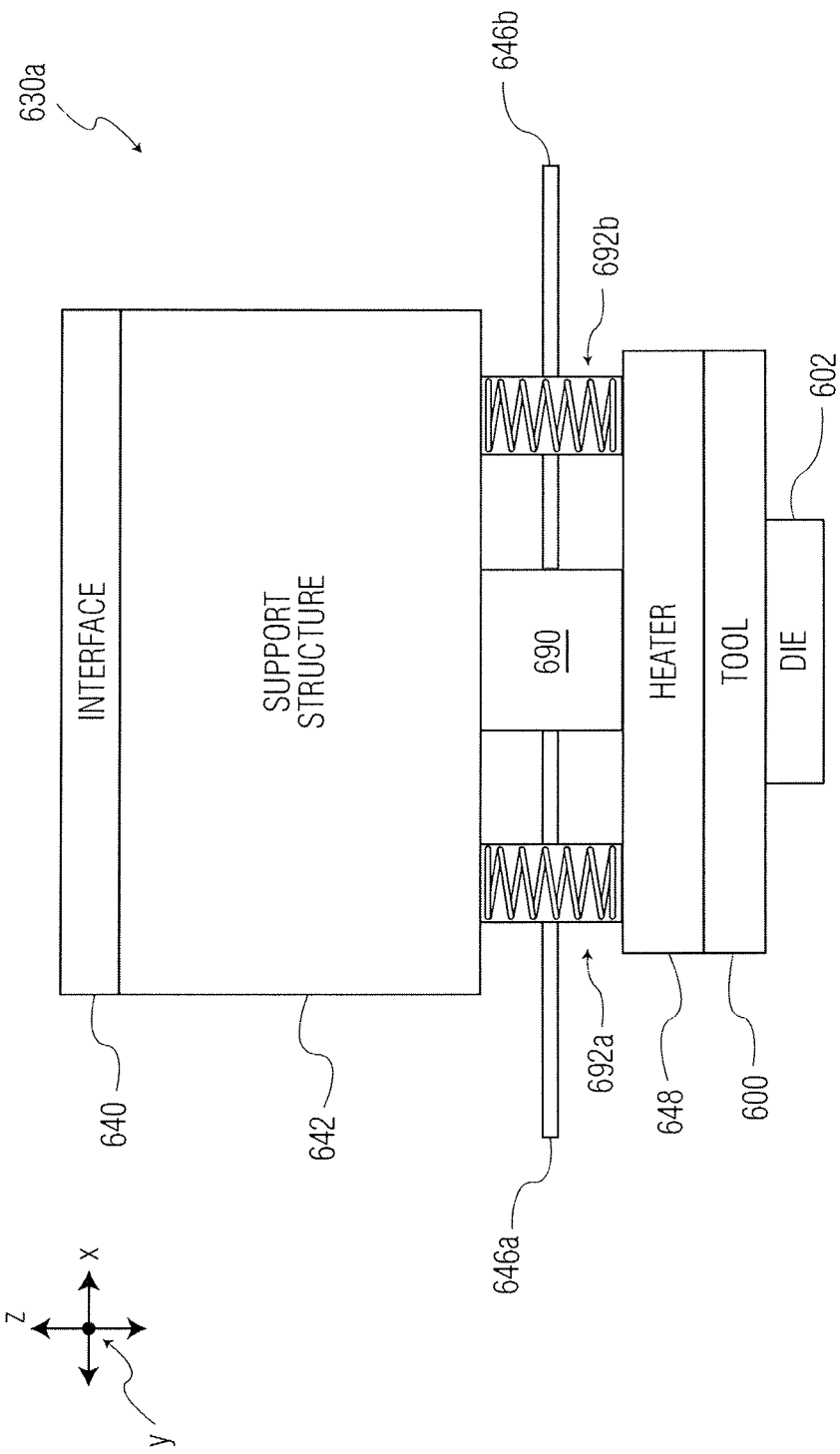

BOND HEADS FOR THERMOCOMPRESSION BONDERS, THERMOCOMPRESSION BONDERS, AND METHODS OF OPERATING THE SAME

CROSS-REFERENCE TO RELATED APPLICATION

This application claims the benefit of U.S. Provisional Application No. 61/842,081, filed Jul. 2, 2013, the contents of which are incorporated herein by reference.

FIELD OF THE INVENTION

The present invention relates to semiconductor bonding machines, and more particularly, to improved bond head assemblies for bonding machines for forming electrical interconnections.

BACKGROUND OF THE INVENTION

The present invention relates to bonding machines and has particular applicability to thermocompression bonding machines and bonding therewith.

Thermocompression bonding machines are be used in bonding a plurality of conductive regions on one substrate to a plurality of conductive regions on another substrate. For example, such bonding machines may be used to bond a semiconductor die (e.g., including conductive regions such as bumps or pillars formed on the die) to another substrate (e.g., where the another substrate may be another die, a wafer, a leadframe, or any other substrate used in packaging). In certain exemplary thermocompression bonding machines, a placer tool (also referred to as a place tool, a placing tool, a bonding tool, or simply a tool to hold or bond a workpiece) is used to bond the one substrate (e.g., a die, also referred to as a workpiece) to the another substrate. In connection with the bonding of the die/workpiece, it may be desirable to heat the die/workpiece, for example, to heat the conductive regions on the die/workpiece.

According to the present invention, novel structures and methods are provided which permit heating of a bonding tool (carrying a workpiece such as a die) to allow proper bonding of the workpiece to an underlying substrate, and then a controlled and rapid cool down of the heater (and thus the bonding tool) before transfer of another workpiece onto the bonding tool to again repeat the cycle.

SUMMARY OF THE INVENTION

According to an exemplary embodiment of the present invention, a bond head for a thermocompression bonder comprises a tool configured to hold a workpiece to be bonded, a heater configured to heat the workpiece to be bonded, and a chamber proximate the heater, the chamber configured to receive a cooling fluid for cooling the heater.

According to another exemplary embodiment of the present invention, a thermocompression bonder comprises a workpiece supply station including a plurality of workpieces, a bonding station, a placer tool for receiving a workpiece from the workpiece supply station and for bonding the workpiece to a substrate at the bonding station, and a cooling station for cooling the placer tool after bonding the workpiece to the substrate.

According to another exemplary embodiment of the present invention, a thermocompression bonder comprises a bond head including (a) a tool configured to hold a workpiece to be bonded, (b) a heater configured to heat the workpiece to be bonded, and (c) a chamber proximate the heater, the chamber configured to receive a cooling fluid for cooling the heater.

According to another exemplary embodiment of the present invention, a thermocompression bonder comprises a bond head including (a) a tool configured to hold a workpiece to be bonded, (b) a heater configured to heat the workpiece to be bonded, and (c) a chamber proximate the heater, the chamber configured to receive a cooling fluid for cooling the heater, the chamber adapted to move between a first position in contact with the heater and a second position out of contact with the heater.

According to another exemplary embodiment of the present invention, a thermocompression bonder comprises a bond head including (a) a tool configured to hold a workpiece to be bonded, (b) a heater configured to heat the workpiece to be bonded, and (c) a chamber proximate the heater, the chamber configured to receive a cooling fluid during a first operational phase, and a second fluid during a second operational phase.

According to another exemplary embodiment of the present invention, a thermocompression bonder comprises a bond head including (a) a tool configured to hold a workpiece to be bonded, (b) a heater configured to heat the workpiece to be bonded, (c) a chamber proximate the heater, the chamber configured to receive a cooling fluid for cooling the heater, (d) a support structure above the heater, and (e) at least two flexures disposed between the support structure and the heater.

According to another exemplary embodiment of the present invention, a method of thermocompressively bonding a workpiece to a substrate comprises the steps of (1) bonding a workpiece to a substrate using a bond head of a thermocompression bonder, the bond head including a heater and (2) providing a cooling fluid into a chamber of the bond head proximate the heater to reduce a temperature of the heater after step (1).

Additional exemplary methods are disclosed herein, such as methods of operating any of the bond heads or bonding machines disclosed or claimed herein.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily deformed or reduced for clarity. Included in the drawing are the following figures:

FIGS. 2A-2D are block diagram views of bonding structures on a lower substrate, bonding structures on an upper substrate, and a conventional method of bonding the upper substrate to the lower substrate;

FIGS. 5A-5B illustrate a chamber being moved in and out of contact with a heater of a bond head assembly in accordance with an exemplary embodiment of the present invention;

FIGS. 6A-6C illustrate bond head assemblies including flexures in accordance with various exemplary embodiments of the present invention.

DETAILED DESCRIPTION OF THE INVENTION

Figure 1:
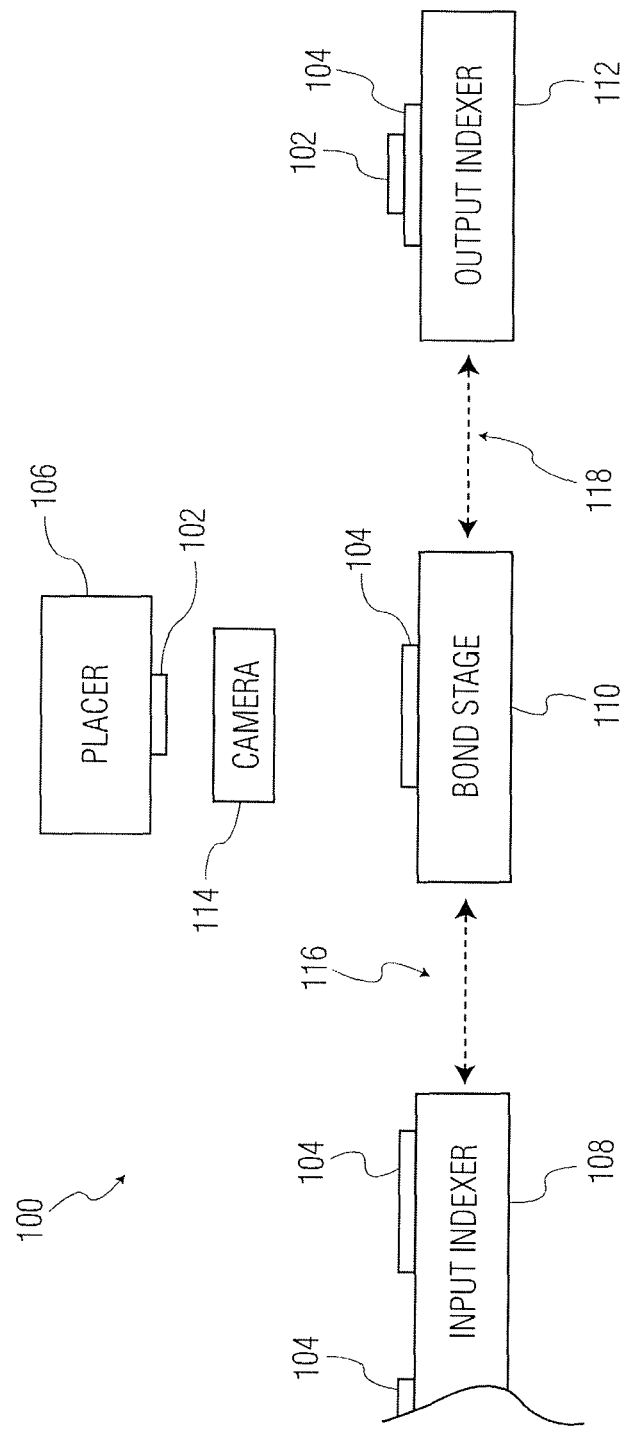
FIG. 1 is a block diagram side view of elements of a conventional thermocompression bonder.

According to certain exemplary embodiments of the present invention, a bond head for a thermocompression bonder (e.g., a die attach bonder) is provided which performs, for example, a local reflow solder attach process. A bonding tool of the bond head places and bonds a first workpiece (e.g., a die, an interposer, etc.) to a second workpiece (e.g., a substrate, a chip, a wafer, etc.) by melting and re-solidifying of solder bumps on the workpiece (e.g., die) being placed. Typically, the bonding tool is in contact with the workpiece being placed during the entire heating cycle (and possibly the cooling cycle), making the temperature ramp up and ramp down using a serial process affecting machine throughput (e.g., units per hour, UPH). Therefore, it is typically desirable to achieve the temperature ramp up and ramp down in the shortest possible time. A challenge is to quickly switch from a heating phase (where a minimal heat loss out of the bonding tool is typically desired) to a cooling phase (where a maximum heat loss out of the bonding tool is typically desired). In accordance with the present invention, bond head structures/assemblies (e.g., for solder die attach) for rapidly switching from a relatively low cooling rate to a much higher cooling rate are provided. For example, a cooling heat sink (e.g., a cooling chamber) is mechanically separated from the heated tool holder during heating, and then brought into contact during cooling. This combines a very low heat transfer into the heat sink during heating, with a very high heat loss into the heat sink during cooling, effectively increasing the speed at which the bonding process can be performed. Since the bonding times are typically several seconds, any time savings is a direct benefit to total machine UPH.

In other exemplary embodiments of the present invention, a cooling heat sink (e.g., a cooling chamber which may be a low thermal mass, high thermal conductive structure) is attached directly to the non-process side of the heater (a side away from the tool which holds the workpiece to be placed). This structure may be filled with different fluids depending upon the present portion of the process. For example, when cooling is desired a cooling fluid will be circulated though the cooling heat sink to remove heat from the heater. During the temperature ramp up segment of the process the cooling heat sink may be purged (e.g., using air) to minimize the effective thermal mass of the heat sink which must be heated during the temperature ramp up segment of the process. Such an exemplary configuration combines a very low heat transfer out of the heat sink during heating with a very high heat loss from the heat sink during cooling, effectively increasing the speed at which the bonding process can be performed.

In other exemplary embodiments of the present invention, a bond head structure is provided that allows for the bonding tool to rapidly heat and cool (where the temperature shift may be hundreds of degrees Celsius) while maintaining a desirable degree of precision positioning of the workpiece to be placed (e.g., die placement to single digit micron or smaller levels). For example, a heater, tool (that holds the workpiece), and the workpiece itself (e.g., a die) are supported on a flexure system whose primary compliance is designed to be radially symmetric from the center of the workpiece. For example, floating screws may pierce portions of the heater and facilitate movement of the heater and flexures during heating, and cooling. Such a configuration may be used to constrain motion of the heater, tool and workpiece to be radially symmetric about the center of the workpiece. This provides compliance to allow for differential expansion to occur in a desirable and predictable fashion.

In thermocompression bonding, it is often desirable to heat the tool of the placer while holding the workpiece to be bonded (e.g., during the bonding process—which may be considered a non-cooling phase)—but it is also desirable to have the tool of the placer at a lower temperature during other operational phases (e.g., a cooling phase) of the process such as during (1) the picking (or transfer) of another workpiece to the tool from a workpiece supply (e.g., a wafer), and/or (2) during initial placing of the workpiece before the high temperature bonding. In accordance with various exemplary embodiments of the present invention, chambers are provided as part of the bond head (also referred to as a bond head assembly), where a cooling fluid may be provided in the chamber. In certain embodiments, two different fluids may be used in such a chamber (e.g., a liquid cooling fluid during the cooling phase, and a fluid such as air during a non-cooling phase). In other embodiments, the chamber (which may use one or more fluids, as desired) may be moved in and out of contact with the heater, or a force between the chamber and heater may be varied.

FIG. 1 is a block diagram side view of elements of thermocompression bonder 100. Die 102 is to be bonded to substrate 104 using placer 106 (including a bond tool) as illustrated in FIG. 1. Placer 106 holds die 102, and substrate 104 is supported by bond stage 110. Camera 114 is shown interposed between placer 106 and bond stage 110 (but could be in other locations), and has split field vision, that is it images both upwardly, towards die 102, and downwardly, towards substrate 104. Of course, other positions and configurations of a camera may be used. Using appropriate mechanisms and visual information provided by camera 114, placer 106 (and/or bond stage 110) is repositioned as necessary to align bonding structures on die 102 with corresponding bonding structures on substrate 104 (see below). Camera 114 is moved so that placer 106 with aligned die 102 may be lowered over substrate 104, and die 102 is bonded to substrate 104. The bonded die 102/substrate 104 structure is indexed, or moved, to output indexer 112 with intermediate elements, not shown but represented by double headed arrow 118. Then, another substrate 104 is taken from input indexer 108, with intermediate elements, not shown but represented by double headed arrow 116, and placed on bond stage 110, and placer 106 takes another die 102 from, for example, a semiconductor wafer or another structure having indexed die 102. Another die 102 is aligned with another substrate 104, using information from repositioned and interposed camera 114, and the process repeats. Of course, many different or additional elements may be included in thermocompression bonder 100, and as such it is understood that the present invention is not limited to integration with the illustrated exemplary configuration of FIG. 1.

The present invention relates to bonding of a first workpiece to another workpiece. The term "substrate" is interchangeably used with the term "workpiece". The workpieces/substrates described herein may be, for example, semiconductor dice, wafers, leadframe devices, interposers (e.g., silicon, glass, etc.), amongst others. In one specific example illustrated herein, the workpiece being bonded by the bond head is a semiconductor die and the substrate to which the semiconductor die is being bonded is a substrate. The conductive regions (also referred to as bonding structures) on each workpiece may be, for example, conductive pillars (e.g., Cu pillars), metalized pads, amongst others.

Figure 2B:
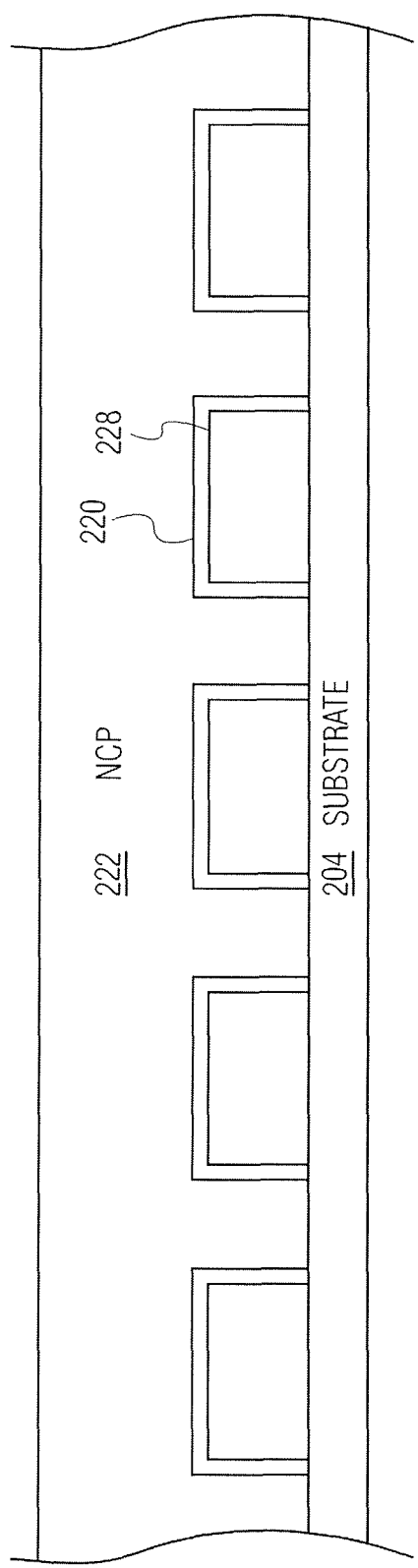

FIGS. 2A-2D illustrate details of bonding structures on lower substrate 204, bonding structures on upper substrate 202 (e.g., a die 202), and the method of bonding die 202 to substrate 204. Specifically, as illustrated in FIG. 2A substrate 204 has bonding structures 228 that may be, for example, copper (Cu) structures 228, such as copper pillars or metalized pads, grown on substrate 204 that collectively form a target conductive region. As shown, optional plating layer 220 may cover Cu structures 228 to facilitate bonding. Plating layer 220 may comprise, for example, solder (e.g., tin (Sn)-based solder) or other materials to facilitate bonding. FIG. 2B illustrates Cu structures 228 and substrate 204 covered with a non-conductive paste (NCP) layer 222. For example, NCP layer 222 may be an encapsulant material marketed by Henkel AG & Co. A non-conductive film (NCF) (not shown) may be provided over upper substrate 202, that is, over pillars 224 and overlying layer 226. As is known to those skilled in the art, pillars 224 tend to push through such an NCF (not shown) during bonding of pillars 224 to corresponding structures 228.

Figure 2C:
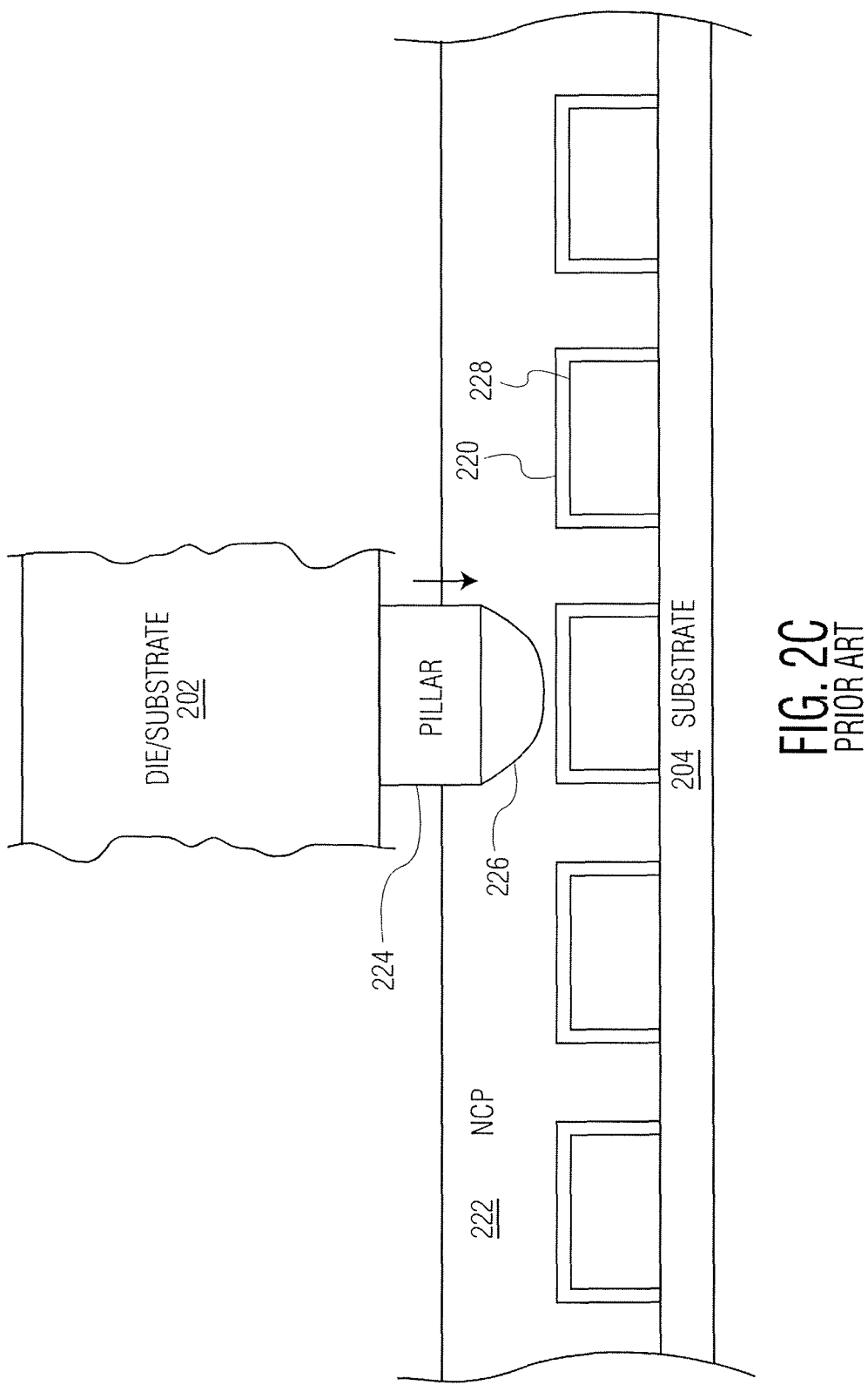
Figure 2D:
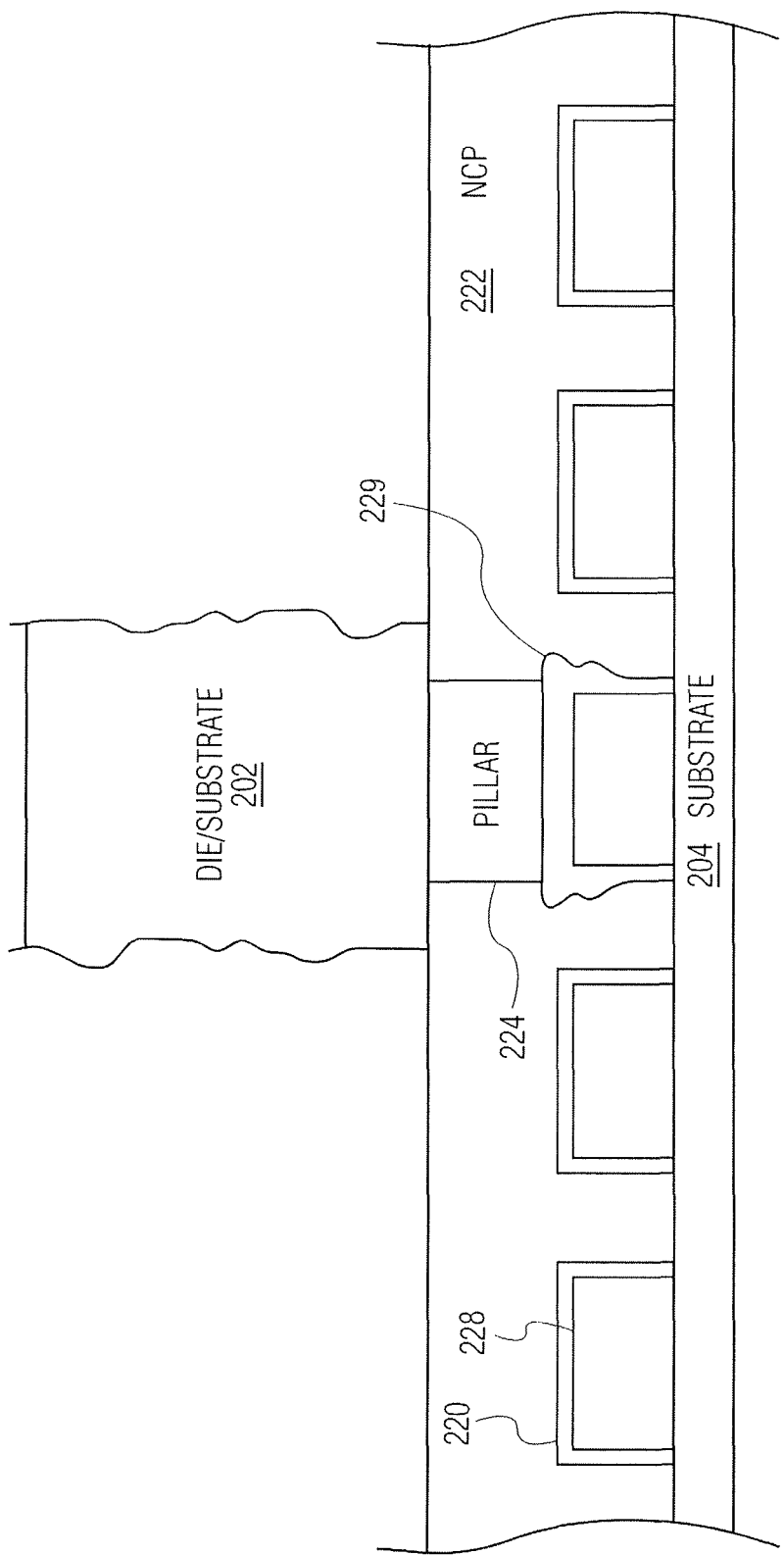

NCP layer 222 may be an adhesive type encapsulant material that may be substantially planar as illustrated. As illustrated in FIG. 2C, die/substrate 202 includes a series of pillars 224 (only one is shown) comprised of, for example, copper (Cu), aluminum (Al), gold (Au), etc. Cu pillars 224 may include an overlying layer 226 of, for example, solder, such as tin-based solder, to facilitate bonding between die Cu pillars 224 with lower substrate Cu structures 228. While FIG. 2C only illustrates one Cu pillar 224 aligned with a corresponding Cu structure 228, die 202 may comprise many Cu pillars 224 that are each aligned with a lower Cu structure 228. It is noted that Cu structures 228 on lower substrate 204 may be elongated structures, which is they may extend along a Y-axis that goes in and out of the paper of FIG. 2C. Regardless, die 202 is lowered such that solder tipped Cu pillar(s) 224 contact, and press into NCP layer 222. When solder tipped Cu pillar(s) 224 engage corresponding plated Cu structures 228, pressure and heat is applied such that Cu pillar(s) 224 are bonded to Cu structure(s) 228 as illustrated in FIG. 2D. In effect Cu pillar solder layer 226 merges/combines with substrate Cu structure plating layer 220 to form interface 229 between Cu pillar 224 and Cu structure 228. NCP layer 222, and any NCF film on the upper substrate 202, may be comprised of a thermal setting material that cures with temperature, so they are kept below a critical temperature, for example below 180° C., as Cu pillars 224 push through NCP layer 222. NCP and NCF may serve to assist in binding, or fixing, bonded die 202 and substrate 204. Die 202 with Cu pillars 224 are heated before/during bonding as will be illustrated in the drawings and described below.

Figure 3A:
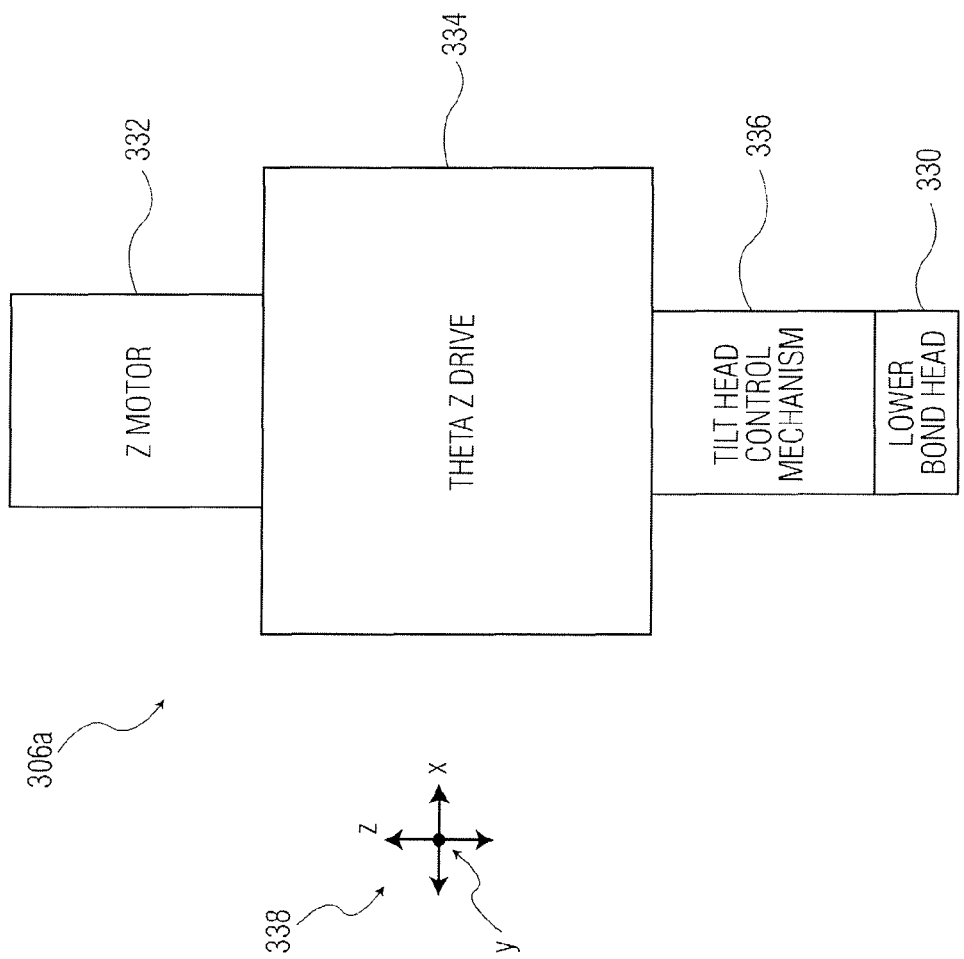
FIG. 3A is a block diagram side view of a bond head assembly in accordance with an exemplary embodiment of the present invention.

FIG. 3A illustrates bond head 306a (which is included in a placer system, similar to the placer 106 shown in FIG. 1, except that bond head 306a includes aspects of the present invention described below). Bond head 306a includes Z-motor 332, theta Z-drive 334, tilt head control mechanism 336, and lower bond head 330. Certain aspects of bond head 306a (including Z-motor 332, theta Z-drive 334, and tilt head control mechanism 336) may be found on the iStack$^{PS}$™ die bonder sold by Kulicke & Soffa Pte Ltd. Tilt head control mechanism 336 may permit tilting of lower bond head 330 in either, or both of, X- and Y-axes (see XYZ legend 338 with the Z-axis up/down, the X-axis to the right/left and the Y-axis coming into and out of the paper of FIG. 3A).

Figure 3B:
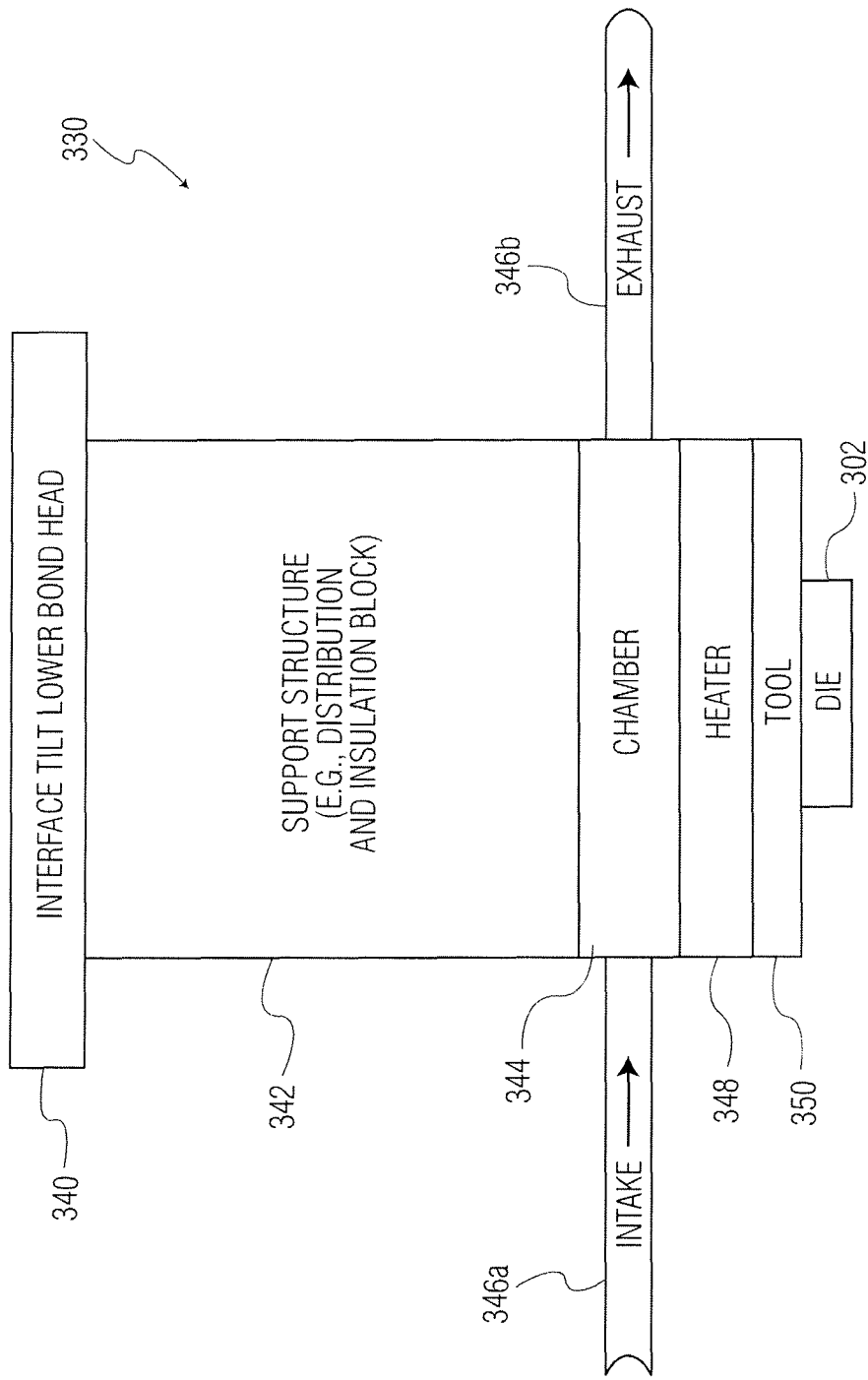
FIG. 3B is a detailed view of a first example lower bond head for the bond head assembly of FIG. 3A in accordance with an exemplary embodiment of the present invention.
Figure 3C:
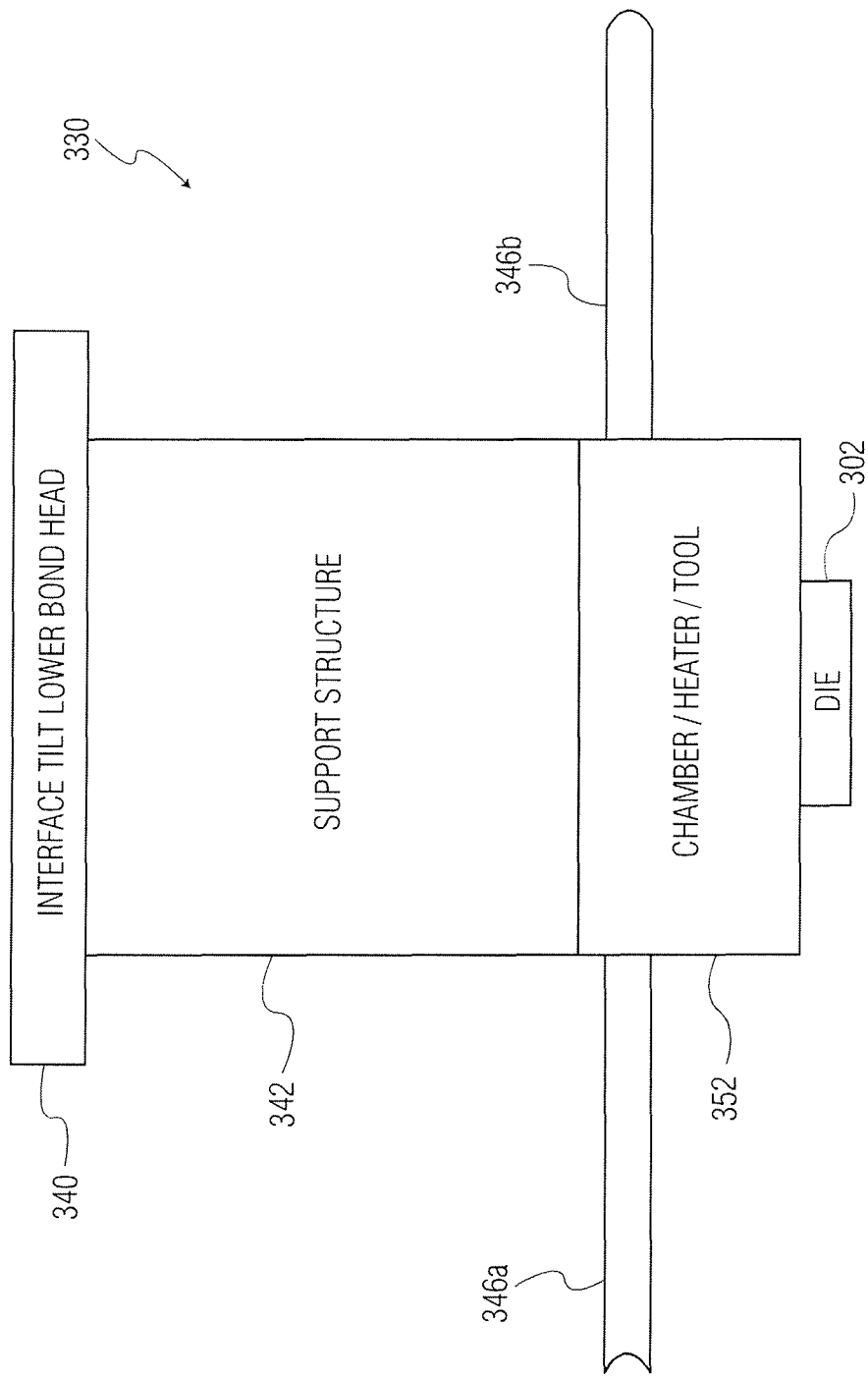
FIG. 3C is a detailed view of a second example lower bond head for the bond head assembly of FIG. 3A in accordance with another exemplary embodiment of the present invention.

FIG. 3B illustrates a more detailed view of lower bond head 330 of FIG. 3A, and includes interface tilt lower bond head 340, support structure (e.g., distribution and insulation block) 342, chamber 344, heater 348, tool 350 and die 302 held by tool 350. Interface tilt lower bond head 340 may include a load cell that measures Z-axis force (downward, bonding force), and optionally may provide for direct Z-force measurement and feedback during bonding of the force applied to die 302. Support structure 342 may represent and include, for example, electrical connections, air connections, water connections, and insulation to isolate lower heater 348. As will be discussed below in greater detail, heater 348 heats tool 350 which heats die 302 before and/or during bonding (e.g., see FIG. 2C-2D). Chamber 344 regulates the temperature, or amount of heat, of heater 348 before, during, and/or after bonding (e.g., assists in ensuring NCP layer 222 shown in FIGS. 2B-2D does not cure prematurely from too high a temperature of die 302/tool 350) and serves to cool heater 348 (and thus tool 350 and die 302) at predetermined points in the bonding cycle. A cooling fluid is brought through chamber 344 using piping or tubing 346a, 346b, with pipe 346a being the inlet pipe and pipe 346b the outlet pipe. Cooling fluid may be brought into chamber 344 during a cooling phase (e.g., after bonding of a workpiece) for cooling of heater 348 from one temperature to a lower predetermined temperature (e.g., a predetermined temperature). The cooling fluid absorbs the heat from heater 348, cooling heater 348 and raising the temperature of the cooling fluid and the higher temperature cooling fluid exits chamber 344 through outlet 346b. FIG. 3C illustrates another embodiment where chamber, heater and tool are integrated into a single structure, chamber/heater/tool structure 352 where the functions are substantially the same. In another example, the heater and tool are integrated into a single structure, with a distinct chamber (where the chamber may take any of the forms disclosed or claimed herein). In yet another example, the chamber and heater are integrated into a single structure, with a distinct tool.

Figure 3D:
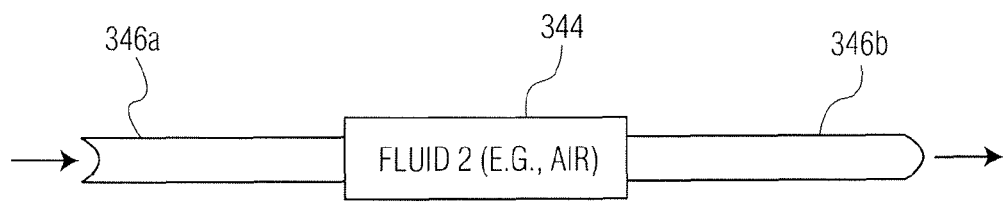
FIGS. 3D-3E are block diagrams illustrating a chamber of a bond head assembly having a fluid therein, in accordance with an exemplary embodiment of the present invention.
Figure 3E:
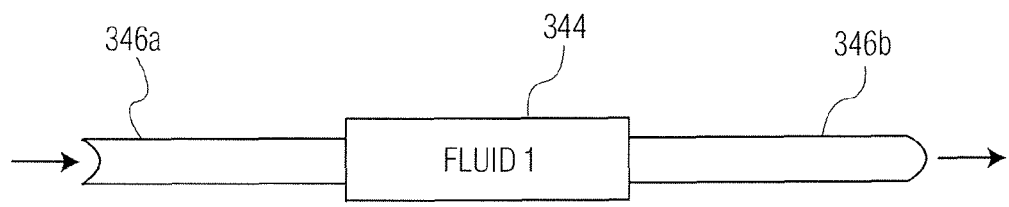

FIG. 3D illustrates chamber 344 filled with a gas, such as air ("fluid 2"), and FIG. 3E illustrates chamber 344 filled with another fluid (e.g., a liquid cooling fluid) ("fluid 1"), having a thermal capacity greater than fluid 2 as fluid 1 is the cooling fluid to cool heater 348. In either respect, fluid 1 is capable of removing heat from heater 348 by conduction (direct contact between the cooling fluid chamber/chamber 344 and heater 348 (or integrated heater of FIG. 3C)), convection (through any air or gas between the cooling fluid chamber/chamber 344 and heater 348 without direct contact), or heat transfer mechanisms. Fluid 2, such as a gas (e.g., air) may have a lower thermal capacity than fluid 1 (such as a liquid having a greater thermal capacity). That is, a cooling liquid fluid would typically require greater energy to raise the temperature of a set volume of cooling liquid fluid than for the equivalent volume of cooling gas fluid, for example. It is contemplated that a fluid 2 gas could be sufficiently cooled, super cooled, etc., to increase or vary its thermal capacity.

Examples of fluid 2, in gas form, include: air filtered to 0.01 µm; air directly from factory supply lines; etc. Examples of fluid 1, in liquid form, include: water; distilled water; distilled water with a corrosive inhibitor added; ethylene glycol (i.e., automotive antifreeze); non-conductive fluids such fluorinated liquids; etc. Examples of the corrosive inhibitors (that may be added to, e.g., distilled water) are Zalman™ G200 BLUE™ (available from Acoustic PC (www.acousticpc.com)); Red Line Water Wetter® available from Redline Synthetic Oil Corporation of Benicia, Calif.; and Valvoline® Zerex® coolant available from Ashland, Inc. of Covington, Ky. Examples of fluorinated liquids are: 3M® Fluorinert® electronic liquids marketed by the 3M Company of St. Paul, Minn.; and Galden® PFPE high performance, inert fluorinated liquids marketed by Solvay Plastics (www.solvayplastics.com).

Figure 4:
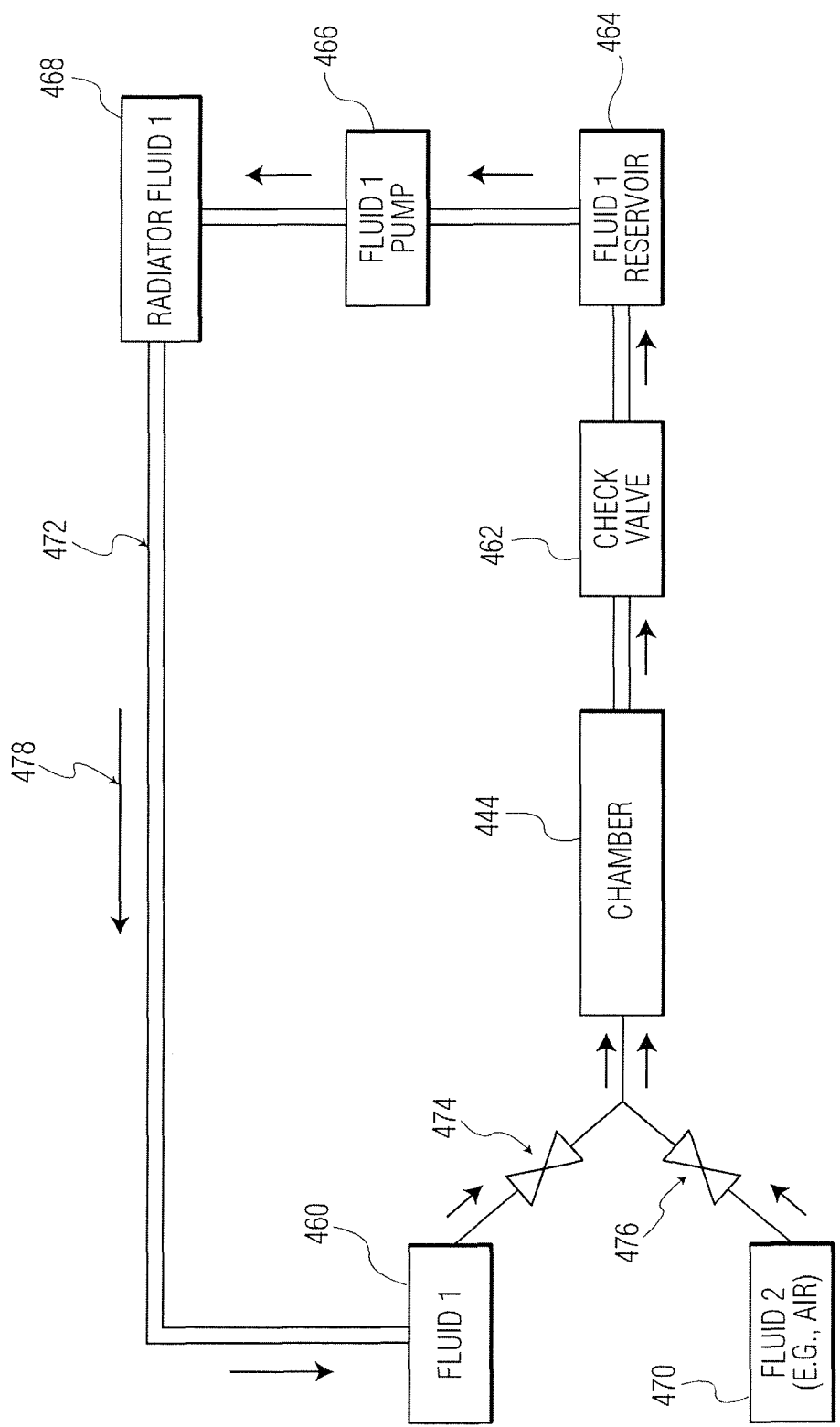
FIG. 4 is block diagram illustrating recirculation of a cooling liquid fluid through a chamber of a bond head assembly in accordance with an exemplary embodiment of the present invention.

FIG. 4 is a block diagram of recirculation of a cooling liquid fluid (e.g., fluid 1) through chamber 444 which may by used in connection with the structure of FIGS. 3A-3E, where chamber 444 replaces chamber 344/352 (or other exemplary embodiments of the present invention illustrated and/or described herein). As illustrated a cooling liquid fluid may be supplied by fluid tank 460 to chamber 444 when valve 474 is open. The cooling liquid enters chamber 444, travels through chamber 444 (where it may, or may not, cool a heater or the like (not shown)) and exits. The (warmed/heated) cooling liquid passes through check valve 462 (explained in greater detail below) and into cooling liquid reservoir 464. Fluid pump 466 pumps the fluid 1 through the system and pumps the heated cooling liquid from cooling liquid reservoir 464 to radiator 468. Radiator 468 permits the heat/excess heat from the heated cooling liquid fluid to be removed by, for example, radiator action, to bring the temperature of the cooling liquid to an acceptable level. The cooled liquid fluid then returns to liquid tank 460 through pipe 472, as at arrow 478 and may recirculate though the system. Fluid 2 (e.g., air) is provided from tank 470, and may be used to replace, remove, or blow out, cooling liquid fluid from chamber 444. During this process, liquid valve 474 is closed and air/gas valve 476 is opened. The air is pumped into chamber 444 and displaces the cooling liquid, with the cooling fluid exiting chamber 444 through check valve 462. When the air displaces a sufficient amount of the cooling liquid in chamber 444, the air exits chamber 444 and into check valve 462. An air exhaust valve (e.g., a bleeder valve) may be provided somewhere in the system (e.g., somewhere between or proximate elements 462, 464, 466, and 468) to remove, or bleed off, any air left in the system. It is noted that the elements and configuration shown in FIG. 4 is exemplary in nature, and may be replaced by different or additional elements (e.g., a different cooling structure may be used as opposed to radiator 468).

Figure 5A:
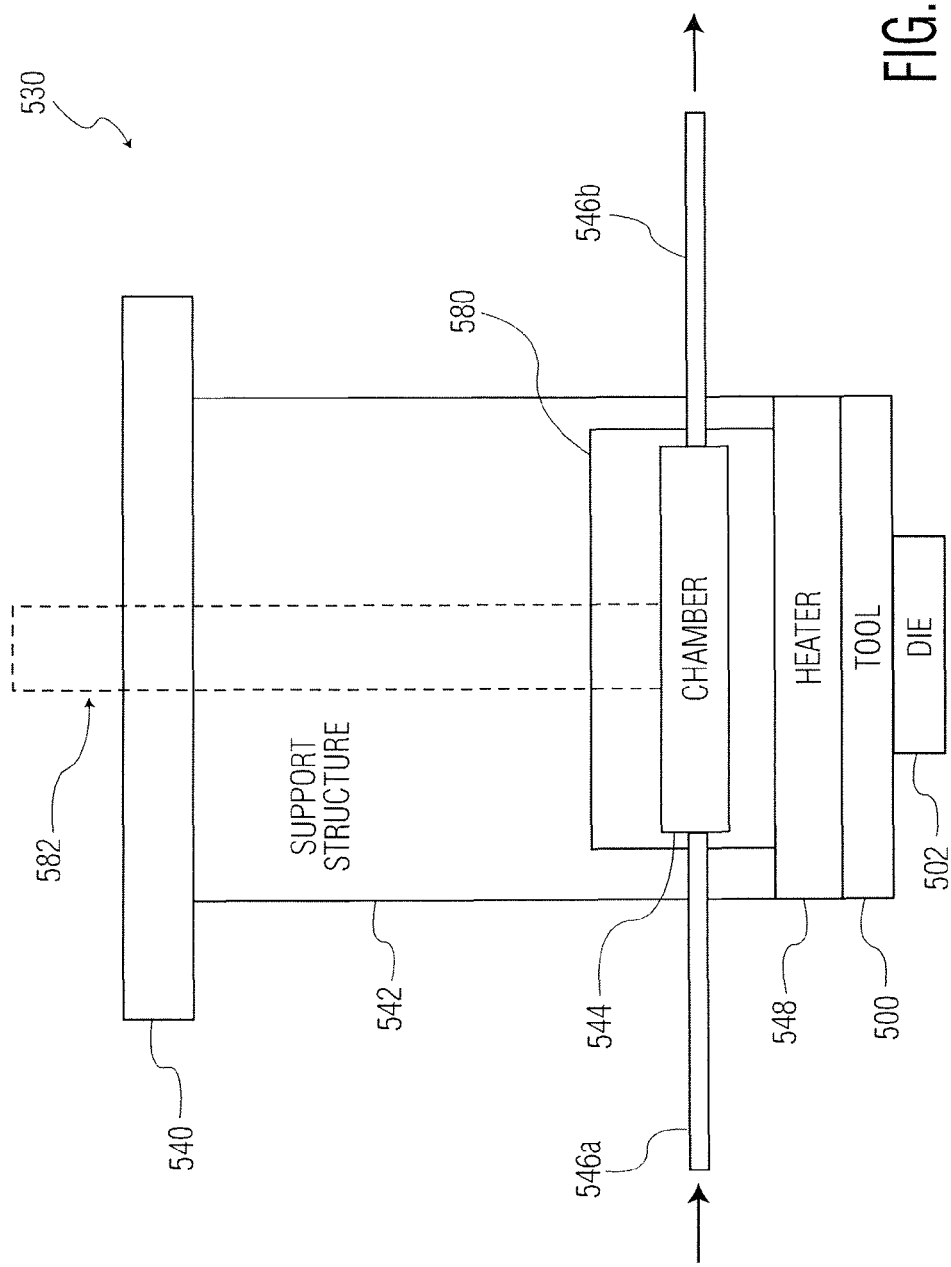

FIGS. 5A-5B illustrate bond head 530 in accordance with an alternate exemplary embodiment of the present invention. Specifically, cavity 580 is defined by support structure 542 and is sized and positioned to accept chamber 544 therein with sufficient room to permit chamber 544 to move upwardly and downwardly within cavity 580. Z-actuator 582 moves chamber 544 along the Z-axis, so as to bring chamber 544 into, and out of, contact with heater 548 to facilitate cooling of heater 548. As illustrated, interface tilt lower bond head 540 is over support structure 542. Support structure 542 includes cavity 580 within which chamber 544 (and inlet and outlet pipes 546a, 546b) may be moved upwardly, away from underlying heater 548, and downwardly to contact heater 548. Inlet pipe 546a brings cooling fluid to chamber 544 and outlet pipe 546b allows removal of (heated) cooling fluid from chamber 544. Tool 500 is below heater 548 and holds die 502. In operation, (e.g., see as FIG. 5B) when heater 548 is to be cooled, chamber 544, with cooling fluid that may be recirculating through chamber 544 (e.g., see FIG. 4), is lowered using Z-actuator 582 to contact heater 548 to absorb heat from heater 548 through, for example, conduction. Cooled recirculating cooling fluid enters chamber 544 through inlet pipe 546a, absorbs heat from heater 548, and heated cooling fluid exits chamber 544 through outlet pipe 546b to be cooled and recirculated (e.g., see FIG. 4).

FIGS. 5A-5B illustrate chamber 544 being moved in and out of contact with heater 548. In an alternative embodiment, where the elements (e.g., chamber 544 and heater 548) remain in contact, a contact force between chamber 544 and heater 548 may be varied in order to change the heat transfer therebetween.

Figure 6C:
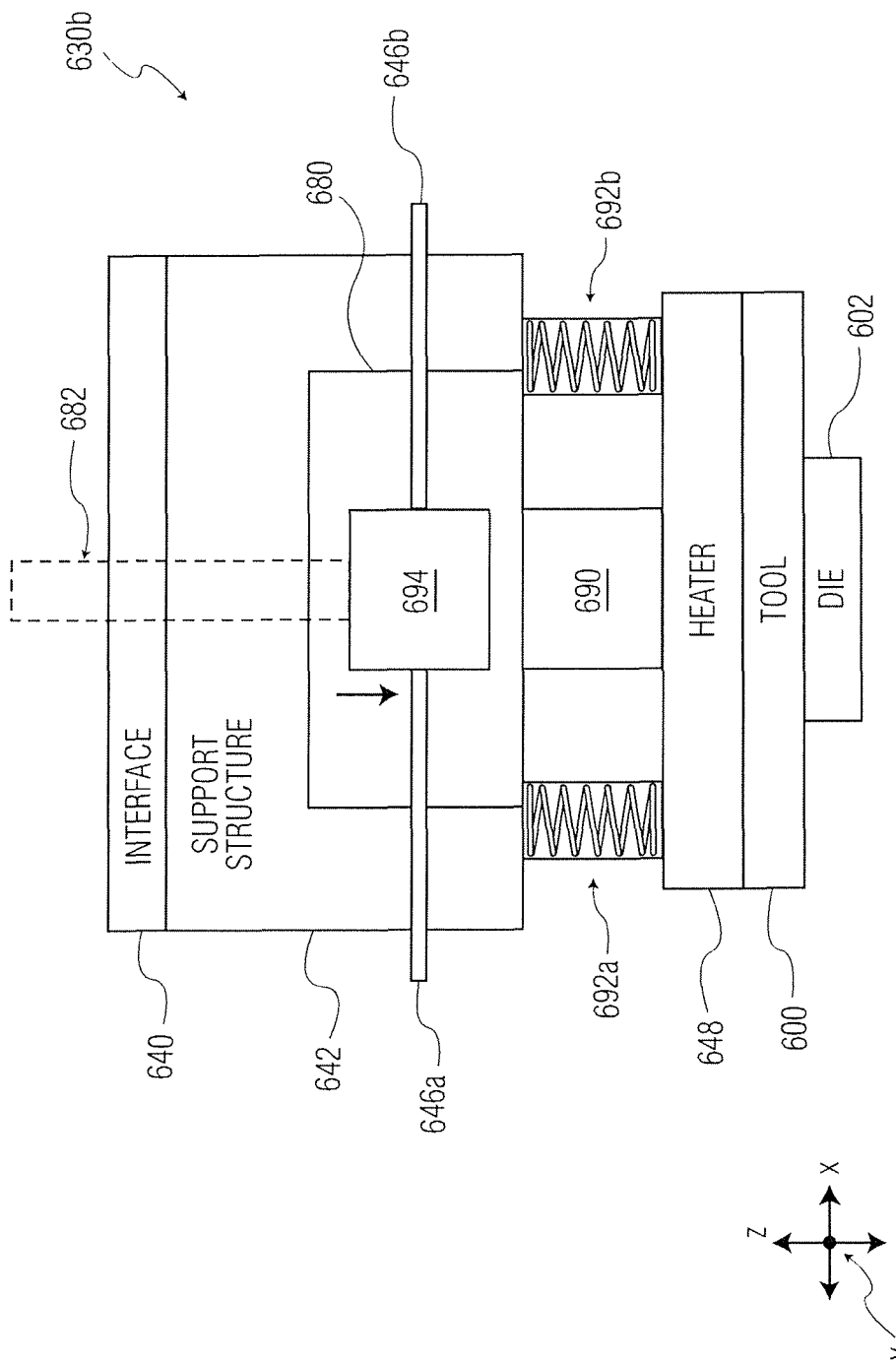

FIGS. 6A-6C illustrate bond heads 630, 630a, 630b in accordance with exemplary embodiments of the present invention with flexures. In FIG. 6A, interface structure 640 is over support structure 642. Linkage 690 and flexures 692a, 692b are interposed between support structure 642 and heater 648. Heater 648 retains tool 600 which in turn carries die 602. During thermocompression bonding, the device holding die 602, for example, tool 600, must be rapidly heated from about 130-150° C. to about 250-300° C. in a minimum amount of time to enable acceptable throughput, that is, a rate of bonding a plurality of die 602 to a target conductive region (e.g., see FIGS. 2A-2D). During bonding, the bonder is required to hold die 602 in position within, for example, 5 µm in any direction. However, the thermal coefficient of expansion of the material comprising heater 648 should be taken into account. For example, aluminum nitride (with which heater 648 may be made from) has a coefficient of expansion of about 4.3 µm/m. For a typical die size of 10 mm by 10 mm, an aluminum nitride heater may expand upwards of 7 µm for a 170° C. temperature rise (from 130° C. to 300° C.) which may cause the die shift outside of an allowed tolerance band, and produce faulty product. To mitigate this phenomenon, flexures 692a, 692b are interposed between heater 648 and support structure 642 of the die bonder. While flexures are illustrated as spring members that expand along the z-axis, this is a simplified illustration.

Specifically, flexures 692a, 692b are anisotropically flexible, that is flexures 692a, 692b are most compliant along a line (and possibly along a vector) that is substantially parallel to the holding surface of the tool, and in a direction from a center of the holding surface of the tool outwards toward the flexures. Stated differently, flexures 692a, 692b are compliant along the X-axis and Y-axis (e.g., see legend in FIG. 6A) in a direction from a center of the holding surface of the tool outwards toward the flexures.

Flexures 692a, 692b may desirably be positioned in a radial pattern between support structure 642 and heater 648, where any number of flexures may be used (only two flexures are illustrated in FIGS. 6A-6C for simplicity). It is desirable that the flexures be configured such that the line/vector of least stiffness points in a direction from the center of the tool to the respective flexure. Each flexure may desirably be designed such that it has the same contribution in resisting the thermal growth of heater 648 as each other flexure. While undergoing thermal growth this will result in a virtual point at the center of the tool to undergo no in-plane motion.

In practice, flexures 692a, 692b may pierce heater 648 using floating screws or the like (not shown). This permits heater 648 to expand laterally (i.e., radially about the virtual center point of the heater), with flexures 692a, 692b guiding the expansion during a heating cycle while keeping a point in the virtual center of the heater from any X-Y in-plane motion.

During a cooling cycle, flexures 692a, 692b guide, or encourage, heater 648/tool 600 to return to it/their initial position, centered about, for example, the tool, during the contraction of the heater. This novel construction defines the growth point of the tool, and ensures that the growth point is predictable.

FIG. 6A illustrates an exemplary embodiment that includes linkage 690 also interposed between heater 648 and support structure 642. Linkage 690 may include, for example, some form of cooling to cool heater 648 as discussed above, and may also include electrical connections, air connections, water connections, cooling fluid connections and insulation to isolate heater 648 (e.g., see support structure 642) from other portions of the bond head. Regardless, linkage 690 may serve to cool heater during predetermined portions of a bonding cycle. Flexures 692a, 692b, also interposed between support structure 642 and heater 648 oppose lateral expansion (thermal growth) of heater 648 during rapid heating of heater 648 during bonding, and maintains die 602 within a predetermine tolerance position, and return flexures 692a, 692b guide die 602 back to its centered position (see above).

FIG. 6B illustrates another exemplary embodiment similar to that of FIG. 6A but with external inlet and outlet pipes/lines 646a, 646b supplying cooled cooling fluid into linkage 690 and removing heated cooling fluid from linkage 690. Linkage 690 may also include electrical connections, air connections, and water connections. Flexures 692a, 692b are similar to those illustrated in FIG. 6A as to location and function.

FIG. 6C illustrates a further exemplary flexure embodiment similar to that of FIG. 6B but with cooling chamber 694 positioned within cavity 680 formed in support structure 642 (e.g., see FIGS. 5A-5B). Linkage 690 and flexures 692a, 692b are interposed between support structure 642 and heater 648. External inlet and outlet pipes/tubing 646a, 646b serve to introduce cooled cooling fluid into cooling chamber 694 and remove heated cooling fluid from cooling chamber 694, respectively. Cooling chamber 694 is configured to move within cavity 680 along at least the Z-axis using Z-actuator 682. For example, after bonding die 602 to an underlying substrate, cooling chamber may be moved downwardly and brought into direct contact with linkage 690, the (cooled) cooling fluid removes heat from linkage 690, to cool, or lower the temperature of, linkage 690. In turn, heater 648 is cooled by contact with cooling/cooled linkage 690, and then tool 600 is cooled by contact with cooling/cooled heater 648. When the cooling process is complete, cooling chamber is moved upwardly using Z-actuator 692 and cooling fluid may still circulate through cooling chamber 694.

For example, in these exemplary flexure embodiments, flexures 692a, 692b may be placed in an equidistant radial pattern about linkage 690 and between support structure 642 and heater 648. Such a spacing may ensure that a center point of heater 648 remains fixed relative to linkage 690, with no in-plane motion so that die 602 has minimal, or no, movement due to the thermal expansion of heater 648 (e.g., see the above discussion for FIGS. 6A-6C). While two flexures 692a, 692b are illustrated in FIGS. 6A-6C, any number may be used, for example, 3, 4, 5, 6, etc., preferably in a radial pattern. It is also contemplated that the flexures may take the form of a unitary anisotropically flexible annular flexure structure (not shown), or portions of an otherwise anisotropically flexible annular flexure structure. Such an annular flexure structure may also include recirculating cooling fluid to maintain its temperature/reduce its temperature and/or reduce the temperature of heater 648. Flexures may maintain their positions on the heater by friction. Further, the flexures are anisotropically flexible in that they are flexible substantially along a line/vector to a holding surface of a bonding tool (or perpendicular to a longitudinal axis along the length of the bonding tool) used to bond the die (workpiece) to the substrate.

In accordance with certain exemplary embodiments of the present invention described above, a cooling chamber is described for contacting a heater and removing heat therefrom (e.g., see FIGS. 3A-3E, FIGS. 5A-5B, etc.). According to a further exemplary embodiment of the present invention, the tool (e.g., tool 350 of FIG. 3B) may be moved to an intermediate cooling stage after bonding a workpiece (e.g., a die) and before picking another such workpiece to be bonded. In such an arrangement (see FIG. 7), the tool may be brought into contact (or at least proximate) a cooling stage to remove heat from the tool. This cooling arrangement may be provided as a replacement for, or in addition to, the various cooling configurations described herein (e.g., including a chamber with a cooling fluid).

Figure 7:
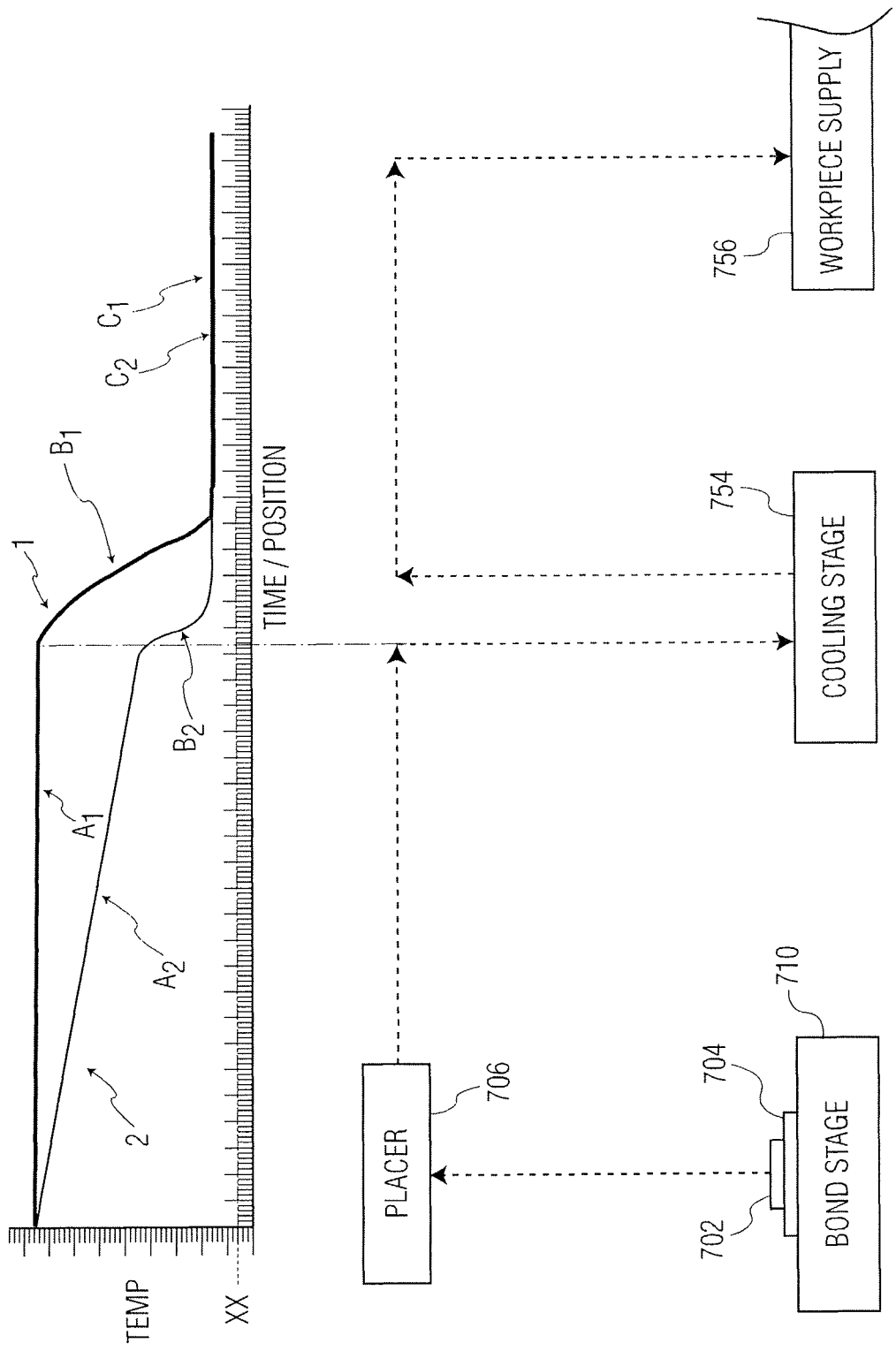
FIG. 7 is a block diagram illustrating operations of elements of a bonding machine in accordance with an exemplary embodiment of the present invention.

FIG. 7 illustrates placer 706 (including a tool, not shown) for holding and bonding a workpiece 702 (e.g., die 702) to an underlying substrate 704 supported by bond stage 710. In FIG. 7, die 702 has already been bonded to substrate 704. Placer 706 is then moved from bond stage 710 to cooling stage 754 that is included as part of (or provided proximate to) the thermocompression bonder. Placer 706 is brought into contact with (or at least proximate) cooling stage 754 where heat from placer 706 is absorbed or otherwise removed. For example, a tool (not shown) of placer 706 may be brought into contact with a cooling pad of cooling stage 754, thereby reducing the temperature of placer 706 (i.e., reducing the temperature of the relevant portion of placer 706 such as the tool and heater, not shown). Cooled placer 706 is then removed from cooling stage 754 and moved to workpiece supply 756 (e.g., a wafer) to obtain another workpiece (e.g., to pick another die from a wafer).

As provided above, an intermediate cooling stage (such as stage 754 shown in FIG. 7) may be provided as an alternative to, or in addition to, cooling from a chamber as described in the various embodiments above. FIG. 7 also illustrates two temperature versus time curves. Curve 1 relates to use of an intermediate cooling stage without an integrated cooling chamber, while curve 2 relates to an arrangement including an integrated chamber cooling (e.g., as in FIGS. 3A-3E) plus use of an intermediate cooling stage. Referring to curve 1, after leaving bond stage 710 the temperature curve is substantially flat (see area $A_1$) as there is no intentional cooling. When placer 706 reaches cooling stage 754 the temperature drops rapidly as shown at area $B_1$ until the temperature normalizes at area $C_1$. Referring to curve 2, after leaving bond stage 710 the temperature curve is decreasing continuously due to the chamber cooling (see area $A_2$). When placer 706 reaches cooling stage 754 the temperature drops rapidly as shown at area $B_2$ until the temperature normalizes at area $C_2$. The normalized temperature (at areas $C_1$ and $C_2$) may be below the critical temperature of NCP and/or NCF layers (e.g., see FIG. 2C).

While certain exemplary devices are illustrated and described herein, it is contemplated that other cooling chambers may have differing structures, means, and methods of cooling. For example, a cooling chamber may be provided sufficiently large to accept at least a heater, with the cooling chamber acting as a deep freezer to rapidly cool down a post-bond heater with or without direct contact.

Other alternatives that may be used to vary the heat transfer between the heater and any of the chambers described herein are contemplated. For example, a flow rate of a cooling fluid (e.g., such as the liquid cooling fluids described herein) may be varied depending upon the desired heat transfer and/or depending upon the portion of the bonding process (or other operational phases during non-bonding).

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A bond head for a thermocompression bonder, the bond head comprising:
    a tool configured to hold a workpiece to be bonded;
    a heater configured to heat the workpiece to be bonded; and
    a chamber proximate the heater, the chamber configured to receive a cooling fluid for cooling the heater, the chamber being positioned on a side of the heater, the tool being positioned on an opposite side of the heater, wherein the chamber is in contact with the heater with a variable contact force so as to adjust a heat exchange between the heater and the chamber.

2. The bond head of claim 1, wherein the chamber is moveable relative to the heater to be in and out of contact with the heater.

3. The bond head of claim 1 wherein the cooling fluid has a thermal capacity to absorb heat from the heater during contact between the chamber and the heater.

4. The bond head of claim 1 wherein the cooling fluid is selected from the group consisting of water, ethylene glycol and fluorinated liquid.

5. The bond head of claim 1 wherein the cooling fluid is received in the chamber during a first operational phase, and a second fluid is received in the chamber during a second operational phase.

6. The bond head of claim 5 wherein the first operational phase is a cooling phase and the second operational phase is a non-cooling phase.

7. The bond head of claim 5 wherein the second fluid is air.

8. The bond head of claim 1 wherein the cooling fluid includes a corrosive inhibitor.

9. The bond head of claim 1 further comprising at least two flexures disposed between a support structure of the bond head and the heater.

10. The bond head of claim 1 wherein the tool, the heater and the chamber are integrated in a single structure.

11. The bond head of claim 1 wherein the chamber is disposed within a cavity of a support structure of the bond head above the heater.

12. A thermocompression bonder comprising:
    a bond head including (a) a tool configured to hold a workpiece to be bonded, (b) a heater configured to heat the workpiece to be bonded, and (c) a chamber proximate the heater, the chamber configured to receive a cooling fluid for cooling the heater, the chamber being positioned on a side of the heater, the tool being positioned on an opposite side of the heater, wherein the chamber is in contact with the heater with a variable contact force so as to adjust a heat exchange between the heater and the chamber.

13. A thermocompression bonder comprising:
    a bond head including (a) a tool configured to hold a workpiece to be bonded, (b) a heater configured to heat the workpiece to be bonded, and (c) a chamber proximate the heater, the chamber configured to receive a cooling fluid for cooling the heater, the chamber adapted to move between a first position in contact with the heater and a second position out of contact with the heater the chamber being positioned on a side of the heater, the tool being positioned on an opposite side of the heater, wherein the chamber is in contact with the heater with a variable contact force so as to adjust a heat exchange between the heater and the chamber.

14. A thermocompression bonder comprising:
    a bond head including (a) a tool configured to hold a workpiece to be bonded, (b) a heater configured to heat the workpiece to be bonded, and (c) a chamber proximate the heater, the chamber configured to receive a cooling fluid during a first operational phase, and a second fluid during a second operational phase, the chamber being positioned on a side of the heater, the tool being positioned on an opposite side of the heater, wherein the chamber is in contact with the heater with a variable contact force so as to adjust a heat exchange between the heater and the chamber.

15. A thermocompression bonder comprising:
    a bond head including (a) a tool configured to hold a workpiece to be bonded, (b) a heater configured to heat the workpiece to be bonded, (c) a chamber proximate the heater, the chamber configured to receive a cooling fluid for cooling the heater, (d) a support structure above the heater, and (e) at least two flexures disposed between the support structure and the heater, the chamber being positioned on a side of the heater, the tool being positioned on an opposite side of the heater, wherein the chamber is in contact with the heater with a variable contact force so as to adjust a heat exchange between the heater and the chamber.

16. A bond head for a thermocompression bonder, the bond head comprising:
    a tool configured to hold a workpiece to be bonded;
    a heater configured to heat the workpiece to be bonded; and
    a chamber proximate the heater, the chamber configured to receive a cooling fluid for cooling the heater, the chamber being positioned on a side of the heater, the tool being positioned on an opposite side of the heater, wherein the chamber is moveable relative to the heater to be in and out of contact with the heater.

17. The bond head of claim 16 wherein the chamber is in contact with the heater with a variable contact force so as to adjust a heat exchange between the heater and the chamber.

18. The bond head of claim 16 wherein the cooling fluid has a thermal capacity to absorb heat from the heater during contact between the chamber and the heater.

19. The bond head of claim 16 wherein the cooling fluid is selected from the group consisting of water, ethylene glycol and fluorinated liquid.

20. The bond head of claim 16 wherein the cooling fluid is received in the chamber during a first operational phase, and a second fluid is received in the chamber during a second operational phase.

21. The bond head of claim 20 wherein the first operational phase is a cooling phase and the second operational phase is a non-cooling phase.

22. The bond head of claim 20 wherein the second fluid is air.

23. The bond head of claim 16 wherein the cooling fluid includes a corrosive inhibitor.

24. The bond head of claim 16 further comprising at least two flexures disposed between a support structure of the bond head and the heater.

25. The bond head of claim 16 wherein the tool, the heater and the chamber are integrated in a single structure.

26. The bond head of claim 16 wherein the chamber is disposed within a cavity of a support structure of the bond head above the heater.

27. A thermocompression bonder comprising:
a bond head including (a) a tool configured to hold a workpiece to be bonded, (b) a heater configured to heat the workpiece to be bonded, and (c) a chamber proximate the heater, the chamber configured to receive a cooling fluid for cooling the heater, the chamber being positioned on a side of the heater, the tool being positioned on an opposite side of the heater, wherein the chamber is moveable relative to the heater to be in and out of contact with the heater.

28. A thermocompression bonder comprising:
a bond head including (a) a tool configured to hold a workpiece to be bonded, (b) a heater configured to heat the workpiece to be bonded, and (c) a chamber proximate the heater, the chamber configured to receive a cooling fluid for cooling the heater, the chamber adapted to move between a first position in contact with the heater and a second position out of contact with the heater, the chamber being positioned on a side of the heater, the tool being positioned on an opposite side of the heater.

29. A thermocompression bonder comprising:
a bond head including (a) a tool configured to hold a workpiece to be bonded, (b) a heater configured to heat the workpiece to be bonded, and (c) a chamber proximate the heater, the chamber configured to receive a cooling fluid during a first operational phase, and a second fluid during a second operational phase, the chamber being positioned on a side of the heater, the tool being positioned on an opposite side of the heater, wherein the chamber is moveable relative to the heater to be in and out of contact with the heater.

30. A thermocompression bonder comprising:
a bond head including (a) a tool configured to hold a workpiece to be bonded, (b) a heater configured to heat the workpiece to be bonded, (c) a chamber proximate the heater, the chamber configured to receive a cooling fluid for cooling the heater, (d) a support structure above the heater, and (e) at least two flexures disposed between the support structure and the heater, the chamber being positioned on a side of the heater, the tool being positioned on an opposite side of the heater, wherein the chamber is moveable relative to the heater to be in and out of contact with the heater.

* * * * *